US007589567B1

(12) United States Patent
Farjadrad

(10) Patent No.: US 7,589,567 B1
(45) Date of Patent: Sep. 15, 2009

(54) COMPENSATION TECHNIQUE FOR CURRENT SOURCE CHANNEL-LENGTH MODULATION

(75) Inventor: Ramin Farjadrad, Mt. View, CA (US)

(73) Assignee: Aquantia Corporation, Milpitas, CA (US)

( * ) Notice: Subject to any disclaimer, the term of this patent is extended or adjusted under 35 U.S.C. 154(b) by 407 days.

(21) Appl. No.: 11/508,593

(22) Filed: Aug. 22, 2006

Related U.S. Application Data

(60) Provisional application No. 60/710,421, filed on Aug. 22, 2005.

(51) Int. Cl.
*G01R 19/00* (2006.01)

(52) U.S. Cl. ........................................ 327/55; 327/347

(58) Field of Classification Search .................. 327/52, 327/55, 347, 348, 361, 362
See application file for complete search history.

(56) References Cited

U.S. PATENT DOCUMENTS 5,526,314 A * 6/1996 Kumar ....................... 365/207
7,439,775 B2 * 10/2008 Sohn ........................... 327/55

* cited by examiner

*Primary Examiner*—Shawn Riley
(74) *Attorney, Agent, or Firm*—Sawyer Law Group P.C.

(57) ABSTRACT

A circuit is provided that includes a current source, and a compensation circuit to generate a compensation current based on an output voltage of the current source. The circuit further includes a combiner to combine the compensation current with an output current of the current source to substantially cancel a channel-length modulation effect associated with the output current of the current source.

19 Claims, 3 Drawing Sheets

COMPENSATION TECHNIQUE FOR CURRENT SOURCE CHANNEL-LENGTH MODULATION

CROSS-REFERENCE TO RELATED APPLICATIONS

This application claims benefit under 35 USC 119(e) of Provisional Application No. 60/710,421, filed on Aug. 22, 2005.

FIELD OF THE INVENTION

The present invention relates generally to electrical circuits.

BACKGROUND OF THE INVENTION

An important aspect in implementing an ideal current source is achieving infinite output impedance. However, channel-length modulation of active devices associated with a current source generally limits the output impedance of the current source by causing the output current to be a function of the output voltage. Channel-length modulation is the effect of a pinchoff region forming before the drain of a transistor under a large drain bias. The pinchoff region shortens the channel region, and leaves a gap of uninverted silicon between the end of the formed inversion layer.

There are several conventional techniques for improving the limited output impedance of a current source. For example, stacked cascode devices have been implemented with a current source to limit voltage variations on the first stacked device of the current source. Also, operational amplifiers have been implemented within a feedback loop of a current source to force a fixed voltage across the first stacked device of the current source. However, each of these conventional techniques has drawbacks. The current source including stacked cascode devices requires a higher voltage headroom in order to provide enough saturation voltage for the stacked devices. The operational amplifier approach is only effective within the feedback loop bandwidth and, therefore, such an approach is not useful for high-speed low-power applications.

Channel-length modulation becomes a more serious problem in applications in which there are very large output swings with limited headroom and high linearity requirements. An example of such an application is an output driver (e.g., a current digital-to-analog converter) in a 10GBASE-T application in which the links are bi-directional and an outgoing signal is superimposed with an incoming signal, both having an amplitude of ~2V peak-to-peak (totaling 4V peak-to-peak). In a case where the output driver is a current DAC, the current DAC is typically a 10 bit DAC having a 60 dB linearity requirement. While one can simply increase the supply voltage to increase the headroom, the increase in headroom comes at a high cost of power, as well as the need to implement inferior high voltage devices.

BRIEF SUMMARY OF THE INVENTION

In general, in one aspect, this specification describes a circuit that includes a current source, and a channel-length modulation compensation circuit to generate a compensation current based on an output voltage of the current source. The circuit further includes a combiner to combine the compensation current with an output current of the current source to substantially cancel a channel-length modulation effect associated with the output current of the current source.

Implementations can include one or more of the following features. The channel-length modulation compensation circuit can have a linear $I_{out}$-$V_{in}$ transfer function across a dynamic voltage range. An input to the channel-length modulation compensation circuit can be an attenuated version of the output voltage of the current source. The current source can be a differential current source. The channel-length modulation compensation circuit can comprise two NMOS transistors that are cross-coupled in parallel, a first resistor r coupled in between the two NMOS transistors, and a second resistor R and a third resistor R respectively coupled between a gate of each of the two NMOS transistors and a leg of the differential current source. An amount of the attenuation of the output voltage of the current source can be controlled by a ratio of the first resistor r to the second resistor R and the third resistor R. Resistance values of the second resistor R and the third resistor R can be much greater than a resistance value of the first resistor r. The channel-length modulation compensation circuit can further comprise a first floating capacitor connected in parallel to the second resistor R, and a second floating capacitor connected in parallel to the third resistor R.

Implementations can further include one or more of the following features. The first resistor r, the second resistor R, the third resistors R, the first floating capacitor, the second floating capacitor, and capacitance associated with the channel-length modulation compensation circuit can form an all-pass filter to substantially eliminate an RC low-pass effect associated with the channel-length modulation compensation circuit. The compensation current generated by the channel-length modulation compensation circuit can be broken into two components with different weights and summed in opposite direction to relax a tail current requirement associated with the channel-length modulation compensation circuit. The circuit can further include an adaptation engine to optimize the compensation current generated by the channel-length modulation compensation circuit. The adaptation engine can implement an adaptation algorithm to optimize the compensation current generated by the channel-length modulation compensation circuit. The adaptation algorithm can be one of the Steepest Decent algorithm or the Least Means Square (LMS) algorithm.

The details of one or more implementations are set forth in the accompanying drawings and the description below. Other features and advantages will be apparent from the description and drawings.

BRIEF DESCRIPTION OF THE DRAWINGS

Like reference symbols in the various drawings indicate like elements.

DETAILED DESCRIPTION OF THE INVENTION

The present invention relates generally to electrical circuits, and more particularly to a channel modulation compensation circuit for use in a current source. The following description is presented to enable one of ordinary skill in the art to make and use the invention and is provided in the context of a patent application and its requirements. Various modifications to implementations and the generic principles and features described herein will be readily apparent to those skilled in the art. Thus, the present invention is not intended to be limited to the implementations shown but is to be accorded the widest scope consistent with the principles and features described herein.

Figure 1:
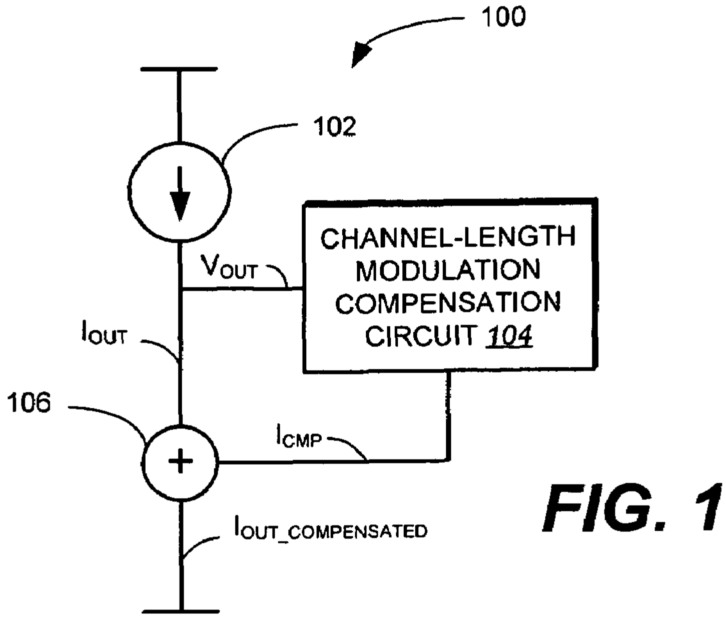
FIG. 1 is a block diagram of a current source including a channel modulation compensation circuit.

FIG. 1 shows block diagram of a circuit 100 including a current source 102 and a channel-length modulation compensation circuit 104 in accordance with one implementation. In one implementation, the channel-length modulation compensation circuit 104 includes two NMOS transistors that are cross-coupled in parallel. The current source 102 generates an output current $I_{OUT}$ for use within an electrical circuit or device, e.g., a current DAC. In general, the output current $I_{OUT}$ is a function of the output voltage $V_{OUT}$ of the current source due to channel-length modulation associated with active devices (e.g., transistors) (not shown) that are associated with the current source 102. Channel-length modulation, in all common transistors such as MOS or Bipolar transistors, is a linear function of the voltage drop across the transistor (e.g., the drain-to-source voltage $V_{DS}$ of a MOS transistor). Accordingly, to compensate for the channel-length modulation effect of the output current $I_{OUT}$ varying as a function of the output voltage $V_{OUT}$, the channel modulation compensation circuit 104 generates a compensation current $I_{CMP}$ that is added (or subtracted) from the output current $I_{OUT}$ (through a combiner 106) to generate a compensated output current $I_{OUT\text{-}COMPENSATED}$. The compensated output current $I_{OUT\text{-}COMPENSATED}$ is substantially corrected from the channel-length modulation effect. In one implementation, the channel modulation compensation circuit 104 probes the output voltage $V_{OUT}$ of the current source 102 and generates the compensation current $I_{CMP}$ based on a voltage level of the output voltage $V_{OUT}$. The current $I_S$ represents the source current of the main stage (e.g., of a current DAC).

Figure 2:
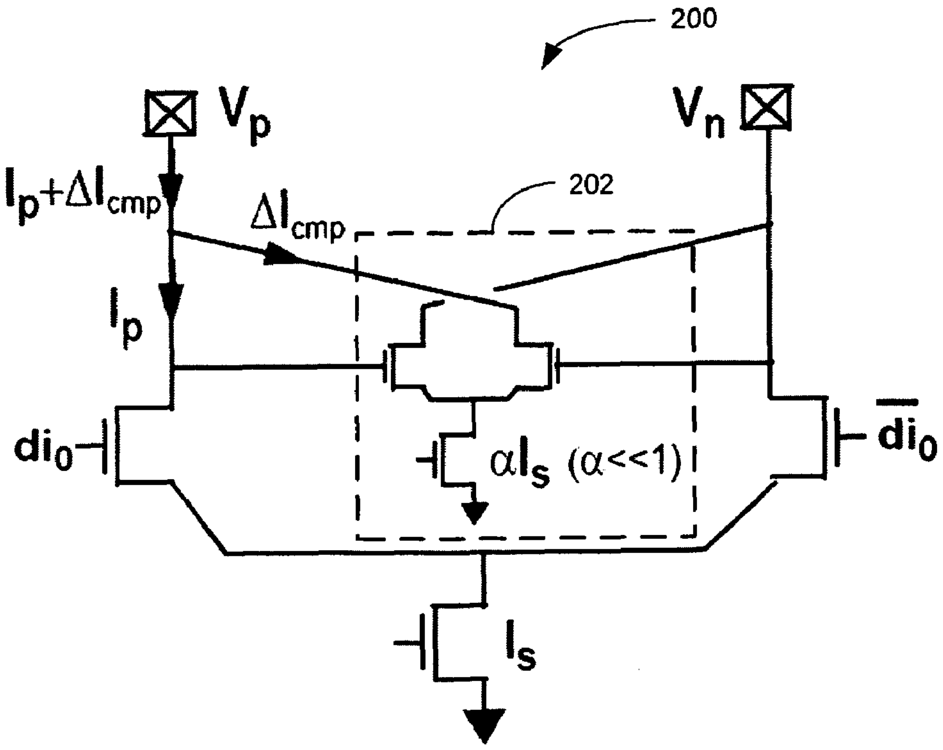
FIG. 2 is a schematic diagram of one implementation of a current source including a channel modulation compensation circuit.

FIG. 2 illustrates a schematic diagram of a differential current source 200 including a channel-length modulation compensation circuit 202 in accordance with one implementation. In one implementation, the differential current source 200 is used as a leg in a current DAC. The differential current source 200 can be used in any other suitable circuit application. At any given time, the output current $I_p$ through the first leg of the differential current source 200 is given as follows (assuming $I_0$ is the output current value for zero output differential voltage—i.e., $V_{diff}=V_p-V_n=0$):

$$I_p=I_0*(1+\lambda*V_p) \quad \text{(eq. 1)}$$

Considering that the output common-mode voltage $V_{com}$ of the differential current source 200 is fixed, the voltage $V_p$ is given as follows:

$$V_p=V_{com}+V_{diff}/2 \quad \text{(eq. 2)}$$

Thus, combining equations 1 and 2 above, the output current $I_p$ is given as follows:

$$I_p=I_0*(k+\gamma*V_{diff}) \quad \text{(eq. 3)}$$

Equation 3 above shows that the output current $I_p$ of the differential current source 200 is a linear function of the output differential voltage $V_{diff}$. Therefore, if the compensation current $\Delta I_{cmp}$ is also a linear function of the output differential voltage $V_{diff}$ with an opposite sign (and adjusted coefficient), then the compensation current $\Delta I_{cmp}$ can substantially cancel out the effect of the channel-length modulation to the first order. In other words, in one implementation, the compensation current $\Delta I_{cmp}$ is given as follows:

$$\Delta I_{cmp}=-\gamma*V_{diff} \quad \text{(eq. 4)}$$

Figure 3:
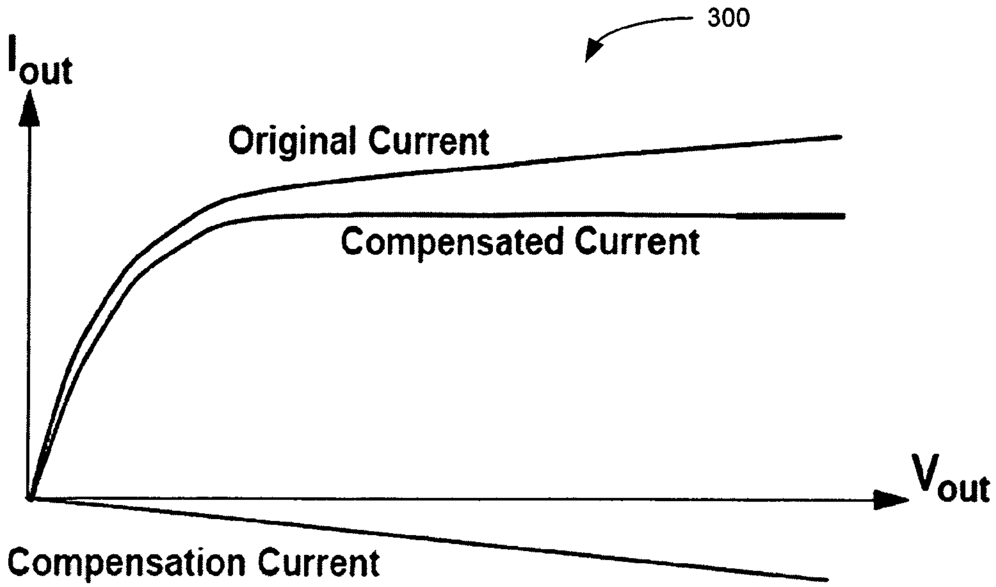
FIG. 3 is a graph of the compensated output current of the current source of FIG. 2.

FIG. 3 shows a current-voltage (I-V) graph 300 of the original (uncompensated) output current, the compensation current $\Delta I^{cmp}$, and the compensated output current $I_{out\text{-}compensated}$ associated with the differential current source 200.

In one implementation, the channel-length modulation compensation circuit 202 has a linear $I_{out}$-$V_{in}$ transfer function so that the compensation current generated by the channel-length modulation compensation circuit 202 can properly compensate the effect of the channel-length modulation. However, (in some implementations) the linearity of the transfer function may not hold valid at all times, as the stage output voltage (i.e., the output voltage of the differential current source) can have a large variation that exceeds the linear input dynamic range of the channel-length modulation compensation circuit. Such an issue is more serious in the case of a bi-directional link driver, where the input signal is superimposed on top of the output going voltage, therefore, creating a much larger output voltage. In general, the compensation current needs to be very small and, therefore, (in one implementation) the tail current of the channel-length modulation compensation circuit needs to be small. The latter imposes an opposite restriction to the requirement for the channel-length modulation compensation circuit to have a wide linear dynamic range, as the smaller the tail current, the smaller the dynamic range of the channel-length modulation compensation circuit.

Figure 4:
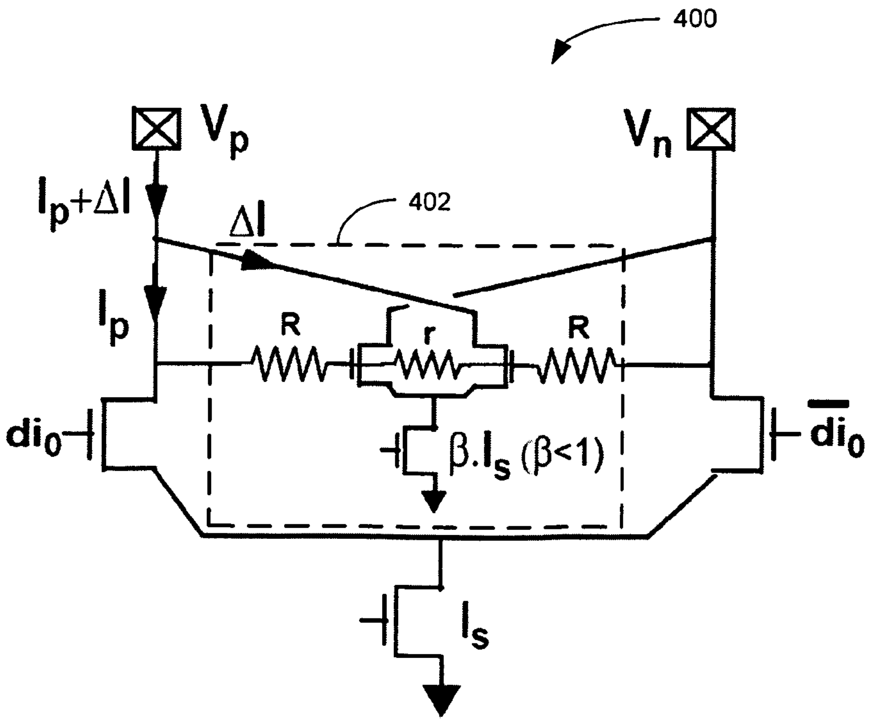
FIG. 4 is a schematic diagram of one implementation of a current source including a channel modulation compensation circuit.

FIG. 4 illustrates a schematic diagram of a differential current source 400 including a channel-length modulation compensation circuit 402 in accordance with one implementation. In the implementation of FIG. 4, the input voltage to the channel-length modulation compensation circuit 402 is an attenuated version of the output voltage of the differential current source 400. Attenuating the voltage swing of the input voltage not only relaxes the need for having a very small tail current, but also helps to constrain (or limit) the input voltage to be within the dynamic range of the channel-length modulation compensation circuit. In one implementation, the amount of attenuation of the input voltage to the channel-length modulation compensation circuit 402 is controlled by the ratio of the middle resistor r to the side resistors R, where R>>r. In one implementation, the combined series resistances of the two side resistors R and the middle resistor r is significantly larger than the output impedance so that the resistors do not change the output impedance by much. In another implementation, the combined series resistances of the two side resistors R and the middle resistor r are taken into account when considering the total output impedance.

In high speed applications, the delay of the channel-length modulation compensation circuit becomes an important factor, as delay compensation can result in correction errors.

While the value of the two side resistors R must typically be large to minimize loading on the output impedance, the small value of the middle resistor r helps reduce the RC time constant at the input of the channel-length modulation compensation circuit. For further bandwidth increase of the resistor structure, (in one implementation) floating capacitors are used within the channel-length modulation compensation circuit as shown in the channel-length modulation compensation circuit 502 of FIG. 5. In one implementation, the floating capacitors, together with the input capacitance of the channel-length modulation compensation circuit 502, form an all-pass filter and, thus, eliminate an RC low-pass effect.

Figure 5:
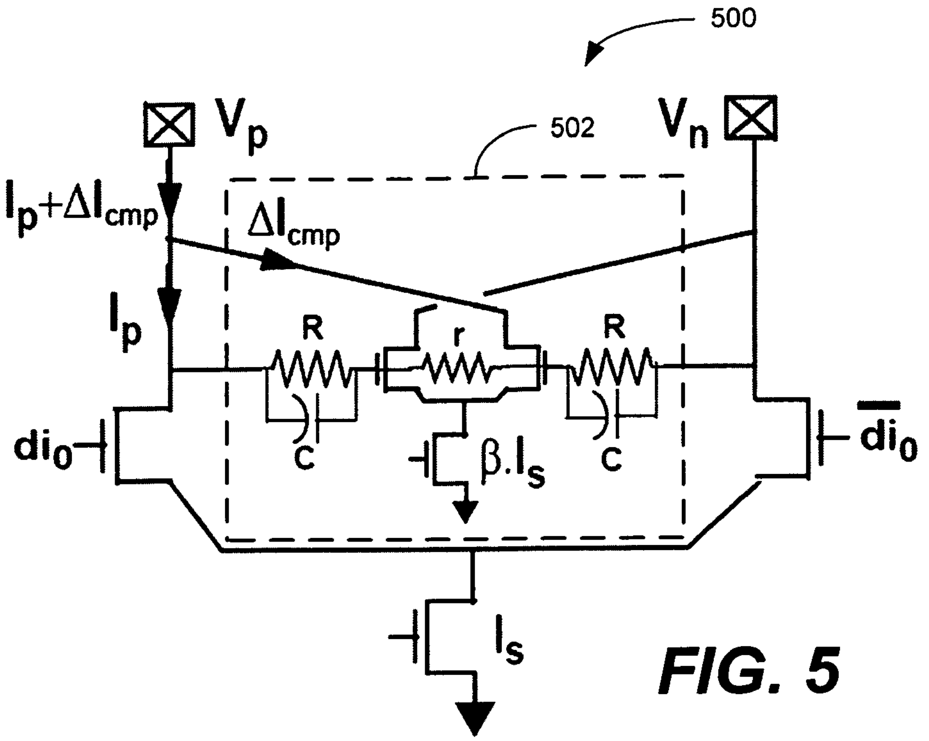
FIG. 5 is a schematic diagram of one implementation of a current source including a channel modulation compensation circuit.

One application for the compensation technique of FIG. 5 is for high resolution current DACs, where the DAC accuracy must not be affected by channel-length modulation. Typically, in high resolution DACs, to minimize integral nonlinearity (INL), differential nonlinearity (DNL), and binary glitch, the top MSB (most significant bits) of the DAC are implemented in a thermometer code fashion. If one wants to implement a channel-length compensation circuit as shown in FIG. 5 for each one of the several thermometer stages, the resistors per stage (compensation circuit) can get very big. However, the subtle point to consider here is that while thermometer coding is required for the DAC MSB bits, such a requirement does not exist for the channel-length compensation circuits that supply a much smaller portion of the current. Therefore, in one implementation, binary scaling is used for each channel-length compensation circuit using binary coding, while thermometer scaling is used for actual DAC stages using thermometer coding. In the latter case, the number of channel-length compensation circuits is reduces to $\log_2 N$, where N is the resolution of the thermometer code. Also, only the smallest stage of the compensation stage will have a large resistor, and as stage size is binary scaled up, the resistor physical size (length) also decreases by a factor of two. This significantly reduces implementation complexity of the improved compensation stage including resistors. It should be noted that the resistor sizes does not have to be exactly scaled with the size of the stage, as the main purpose of the resistors is to attenuate the signal voltage. Therefore, if there resistor values for the smallest legs in the current DAC becomes too large, one can still use lower values resistors, as long as the effective parallel values of all resistors are kept below a pre-determined value as required by the particular application. Another approach to prevent too many resistor attenuators to affect output impedance, is to only have one resistor divider attenuator to feed all the compensation circuits.

Figure 6:
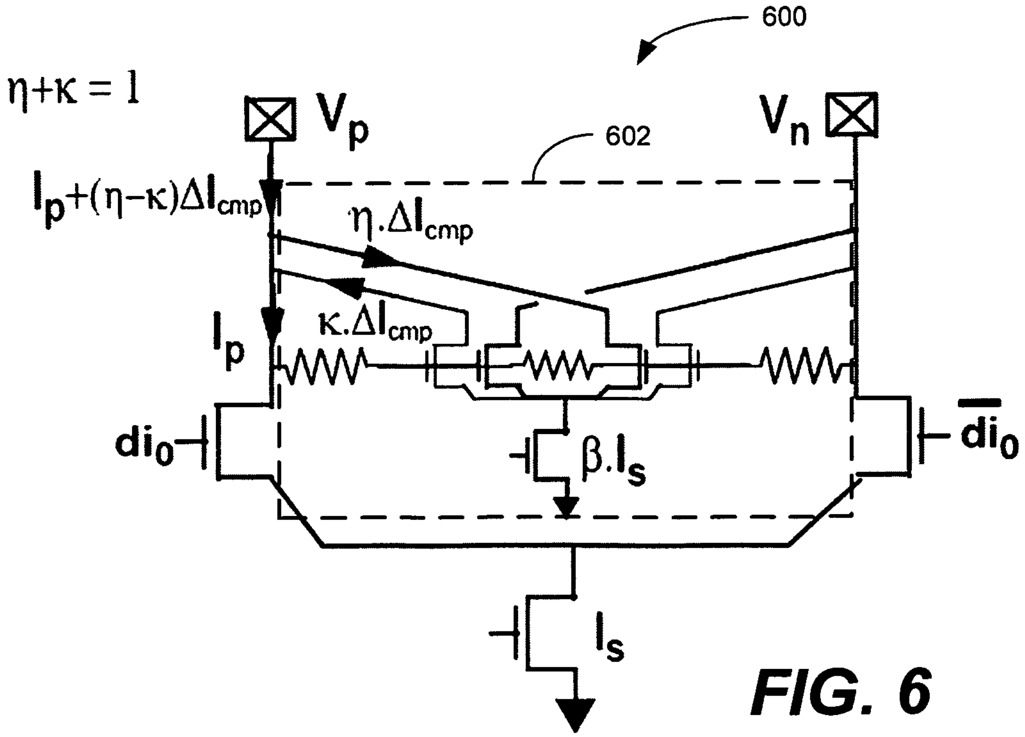
FIG. 6 is a schematic diagram of one implementation of a current source including a channel modulation compensation circuit.

As discussed above, the tail current of the channel-length modulation compensation circuit needs to be small and, therefore, such a requirement imposes a constraint on the channel-length modulation compensation circuit to have a smaller linear dynamic range. An approach to further relax the low tail current requirement is shown in FIG. 6. FIG. 6 illustrates a schematic diagram of a differential current source 600 including a channel-length modulation compensation circuit 602 in accordance with one implementation. In the implementation shown in FIG. 6, the differential compensation current is broken into two components, and are current summed with an opposite sign. For example, if (as shown in FIG. 6) $\eta=0.55$ and $\kappa=0.45$, then the new compensation current will be multiplied by $(\eta-\kappa)=0.1$, or attenuated by an order of magnitude for the same tail current.

In one implementation, the optimum value of the compensation current $\Delta I_{cmp}$ generated by the channel-length modulation compensation circuit can be adjusted by an adaptation algorithm. For example, using means (e.g., a system or circuit) to measure a signal-to-noise ratio (SNR) of a chip including the channel-length modulation compensation circuit, an adaptation engine using the Steepest Decent algorithm can use the SNR gradient as feedback to optimize the compensation current $\Delta I_{cmp}$. In one implementation, the Least Means Square (LMS) algorithm is used by the adaptation engine to optimize the compensation current $\Delta I_{cmp}$. For example, the LMS adaptation equation for the coefficient β can be given as follows:

$$\beta_{n+1} = \beta_n - \frac{\mu}{2} * \frac{d(|e|)^2}{d\beta} \qquad \text{(eq. 5)}$$

where the error signal e considering equation 4 above is given by:

$$e=\Delta I_{out}-\Delta I_{cmp}=\Delta I_{out}+\gamma*V_{diff} \qquad \text{(eq. 6)}$$

where $\Delta I_{out}$ is the error of the output current compared to an ideal current source. Considering that γ is proportional to $\beta(\gamma=k*\beta)$, and that $V_{diff}$ is independent of β, then the following is given:

$$\beta_{n+1} = \beta_n - \frac{\mu}{2} * 2e * \frac{d(e)}{d\beta} \qquad \text{(eq. 7)}$$

and $$\beta_{n+1}=\beta_n-\mu*\kappa(e*V_{diff}) \qquad \text{(eq. 8)}$$

Therefore, having the output differential voltage and measuring the value of the error, one can use the LMS algorithm to adapt the value of the compensation current. As it may be difficult to measure the current differences for an error signal, one can measure the error in the output voltage instead, as the error in the output voltage is proportional to the current error signal.

Various implementations of a channel-length modulation compensation circuit for a current source have been described. Nevertheless, various modifications may be made to the implementations, and those modifications would be within the scope of the present invention. For example, in the case of having a current DAC, one can have a single differential pair of the compensation circuit and apply the scaling to the tail current of the DAC instead. This is mainly to avoid several differential stages using resistor dividers. Accordingly, many modifications may be made without departing from the scope of the present invention.

What is claimed is:

1. A circuit comprising:

a current source;

a compensation circuit to generate a compensation current based on an output voltage of the current source; and a combiner to combine the compensation current with an output current of the current source to substantially cancel a channel-length modulation effect associated with the output current of the current source.

2. The circuit of claim 1, wherein the compensation circuit has a linear $I_{out}$-$V_{in}$ transfer function across a dynamic voltage range.

3. The circuit of claim 1, wherein an input to the compensation circuit is an attenuated version of the output voltage of the current source.

4. The circuit of claim 3, wherein the current source is a differential current source.

5. The circuit of claim 4, wherein the compensation circuit comprises:

two NMOS transistors that are cross-coupled in parallel;

a first resistor r coupled in between the two NMOS transistors; and a second resistor R and a third resistor R respectively coupled between a gate of each of the two NMOS transistors and a leg of the differential current source.

6. The circuit of claim 5, wherein an amount of the attenuation of the output voltage of the current source is controlled by a ratio of the first resistor r to the second resistor R and the third resistor R.

7. The circuit of claim 6, wherein resistance values of the second resistor R and the third resistor R are much greater than a resistance value of the first resistor r.

8. The circuit of claim 5, wherein the compensation circuit further comprises:

a first floating capacitor connected in parallel to the second resistor R; and a second floating capacitor connected in parallel to the third resistor R.

9. The circuit of claim 8, wherein the first resistor r, the second resistor R, the third resistors R, the first floating capacitor, the second floating capacitor, and capacitance associated with the compensation circuit forms an all-pass filter to substantially eliminate an RC low-pass effect associated with the compensation circuit.

10. The circuit of claim 4, wherein the compensation current generated by the compensation circuit is broken into two components with different weights and summed in opposite direction to relax a tail current requirement associated with the compensation circuit.

11. The circuit of claim 4, further comprising an adaptation engine to optimize the compensation current generated by the compensation circuit.

12. The circuit of claim 11, wherein the adaptation engine implements an adaptation algorithm to optimize the compensation current generated by the compensation circuit.

13. The circuit of claim 12, wherein the adaptation algorithm is one of the Steepest Decent algorithm or the Least Means Square (LMS) algorithm.

14. The circuit of claim 1, wherein the compensation circuit continuously generates the compensation current based on the output voltage of the current source.

15. The circuit of claim 1, wherein the circuit comprises only NMOS transistors.

16. The circuit of claim 1, wherein the compensation circuit comprises two NMOS transistors that are cross-coupled in parallel.

17. A circuit comprising:

a current source;

a compensation circuit to generate a compensation current based on an output voltage of the current source, wherein an input to the compensation circuit is an attenuated version of the output voltage of the current source, and wherein the compensation current generated by the compensation circuit is broken into two components with different weights and summed in opposite direction to relax a tail current requirement associated with the compensation circuit; and a combiner to combine the compensation current with an output current of the current source to substantially cancel a channel-length modulation effect associated with the output current of the current source.

18. A circuit comprising:

a current source;

a compensation circuit to generate a compensation current based on an output voltage of the current source;

an adaptation engine to optimize the compensation current generated by the compensation circuit; and a combiner to combine the compensation current with an output current of the current source to substantially cancel a channel-length modulation effect associated with the output current of the current source.

19. The circuit of claim 18, wherein the adaptation engine implements an adaptation algorithm to optimize the compensation current generated by the compensation circuit, and wherein the adaptation algorithm is one of the Steepest Decent algorithm or the Least Means Square (LMS) algorithm.

* * * * *